United States Patent [19]

Coontz et al.

[11] 4,092,733
[45] May 30, 1978

[54] ELECTRICALLY ALTERABLE INTERCONNECTION

[75] Inventors: Leland I. Coontz, Orange; Morton H. Fox, Covina, both of Calif.

[73] Assignee: McDonnell Douglas Corporation, Long Beach, Calif.

[21] Appl. No.: 684,152

[22] Filed: May 7, 1976

[51] Int. Cl.² .................. G11C 5/06; G11C 29/00
[52] U.S. Cl. ..................... 365/200; 307/247 R; 365/184; 365/154
[58] Field of Search ...... 340/173 R, 173 BB, 166 FE, 340/147 T; 307/247 R

[56] References Cited

U.S. PATENT DOCUMENTS

| | | | |
|---|---|---|---|
| 3,755,791 | 8/1973 | Arzubi | 340/173 BB |
| 3,913,072 | 10/1975 | Catt | 340/173 BB |

OTHER PUBLICATIONS

Chin et al., Reversible On-Chip Redundancy Scheme, IBM Technical Disclosure Bulletin, Vol. 14, No. 10, 3/72, pp. 2983-2984.

Primary Examiner—Stuart N. Hecker
Attorney, Agent, or Firm—Kleinberg, Morganstern, Scholnick & Mann

[57] ABSTRACT

An electrically alterable, non-volatile interconnect selectively connects and disconnects microcircuit elements formed on a wafer. The interconnect is formed on the same wafer as the microcircuit elements during the circuit fabrication process to permit electrically controlled reconfiguration of the microcircuit elements on the wafer. This enables wafer scale integration by permitting defective circuit elements to be bypassed and operable, redundant circuits to be substituted for them. MNOS memory transistors provide non-volatile storage of the chosen conductivity state of each interconnect, in the form of impedance differences. In a preferred embodiment, the impedance differences set a flip-flop whose output enables a gate. The gate may include amplification of the signals gated. In one phase of the cycle of operation, the chosen conductivity state of the interconnect may be read into the MNOS memory through the flip-flop.

12 Claims, 8 Drawing Figures

ELECTRICALLY ALTERABLE INTERCONNECTION

BACKGROUND OF THE INVENTION

1. Field of the Invention

The present invention is in the field of microelectronics and specifically relates to an electrically alterable non-volatile switch or gate for use in selectively interconnecting microcircuit elements formed on a wafer.

2. The Prior Art

In U.S. Pat. No. 3,940,740, issued Feb. 24, 1976, and assigned to the assignee of the present application, Coontz describes a powerful method for providing reconfigurable microelectronic circuit devices through the use of a permanently alterable but non-volatile switching device. That patent was primarily concerned with the application of such a device, and its detailed design was not described at length.

The ability to achieve the full-wafer, discretionary wiring described in the Coontz patent has been impeded due to the lack of an economical switching device to permit interconnection of the operable microcircuit elements on the wafer and the disconnection of the defective elements. Attempts to use MNOA (Metal Nitride Oxide Semiconductor) transistors alone to perform the inteconnection function have been unsatisfactory due to the relatively high impedance of the device. Thus, when a number of microcircuit elements were interconnected to form a chain, the series impedance of the MNOS transistors attenuated the signals to unsatisfactory levels.

In U.S. Pat. No. 3,660,827, issued May 2, 1972, Tickle shows a bistable electrical circuit, such as a flip-flop, incorporating insulated-gate field-effect transistors as non-volatile memory elements. Comparable devices are also shown in: U.S. Pat. No. 3,636,530, issued Jan. 18, 1972 to Mark, et al; in U.S. Pat. No. 3,549,911, issued Dec. 22, 1970 to Scott, Jr.; and in U.S. Pat. No. 3,500,142, issued Mar. 10, 1970, to Kahng.

Generally, such bistable circuits were regarded as useful mainly as non-volatile elements of a computer memory. None of the above references, it is believed, suggests the use of such bistable circuits in electrically active interconnect means for selectively connecting microelectronic circuits formed on the same wafer as the bistable devices.

SUMMARY

It has been found that by connecting MNOS elements to active driver circuits in such a manner that the driver may be either turned on (signal passes with amplification) or turned off (extremely high impedance to the signal), the interconnection problems previously associated with MNOS elements may be economically circumvented. The non-volatile nature of the MNOS elements assures that the interconnection, once established, will remain indefinitely, until it is intentionally altered electrically.

A preferred embodiment of the present invention includes an electrically alterable non-volatile MNOS memory, a bistable device such as a flip-flop, and a gate or active driver. The driver is connected to the bistable device and is always in one of two conductive states. Either it is non-conductive, or it is in a conducting state which may include amplifying.

During an initial setting phase, the desired conducting state is impressed on the bistable device by the application of an electrical signal to it. Thereafter, also during the setting phase, the desired state is set into the MNOS memory elements to provide a non-volatile type of operation. Next, during an operating phase, the state of the bistable device is established and maintained by the information stored in the MNOS memory device. The bistable device produces signals indicating which of its two states it is in, and these signals are used to enable the gate or driver through which the interconnection is established.

The interconnect of the present invention is formed on the same substrate and at the same time as the circuits to be interconnected are formed. Activation of a particular interconnection is achieved by electrical signals applied to terminals on the wafer. The use of the interconnect of the present invention makes it possible to form extremely large aggregates of microelectronic elements by connecting operable elements in a desired configuration.

The interconnect therefore may be viewed as a means for implementing a use of redundant circuitry whereby defective elements are disabled and operable elements are substituted for them. The overall result is that thousands of mircoelectronic circuit elements may be interconnected on a single wafer with very high reliability, thereby raising the yield of wafer scale integrated circuitry to economically attractive levels.

In addition to enabling wafer scale integration, the interconnect of the present invention greatly facilitates the computer-controlled reconfiguration of the elements on the wafer, as would be required in adaptive, multimode, or self-repairing circuits.

In a self-repairing mode, a computer tests the elements of the system on the wafer at successive times. Upon discovering an element whose performance is outside of predetermined bounds, the computer generates electrical signals to the interconnects so that the defective element is disconnected from the system and a replacement is substituted for it.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 2 includes FIGS. 2a and 2b.

FIG. 3 includes FIGS. 3a and 3b.

DESCRIPTION OF THE PREFERRED EMBODIMENT

Figure 1:
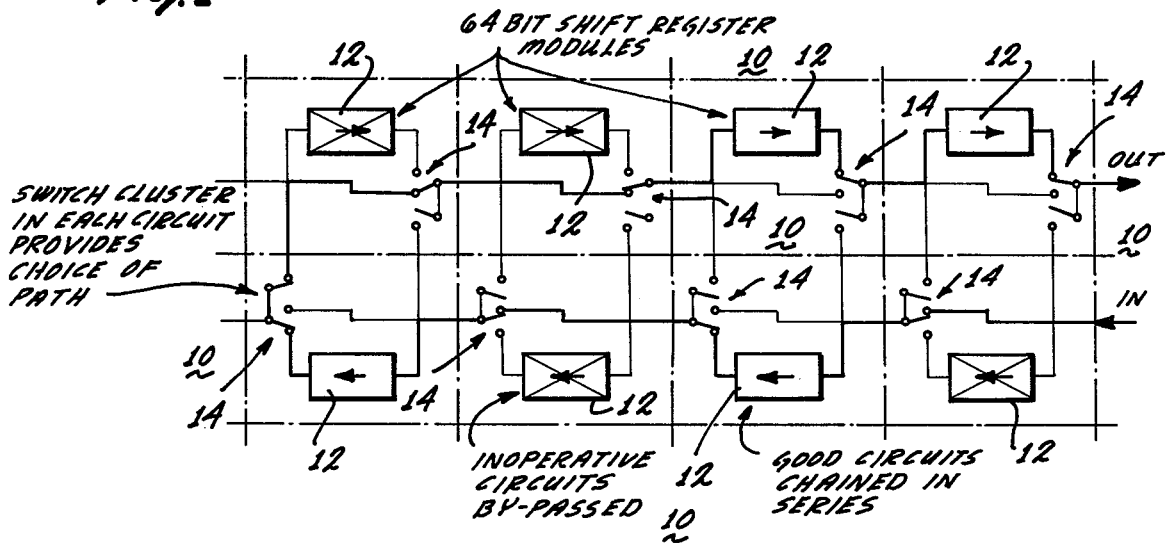
FIG. 1 is a diagram illustrating the use of electrically controlled interconnects to achieve large-scale integration of microcircuit elements formed on a wafer.

Referring now to the drawings, FIG. 1 is a diagram illustrating the use of electrically controlled interconnects to achieve large-scale integration of microcircuit elements formed on a wafer 10. In this particular example, those elements are 64-bit, shift register modules 12. A switch cluster 14 is formed on wafer 10 at the same time the modules 12 are formed.

The shift register modules 12 and the switch clusters 14 are connected together into a basic building block indicated by dashed lines, which block is repeated over the surface of wafer 10. The use of such a repeated pattern of microcircuit elements results in greater reliability and lower cost. In some cases, the tooling for the basic building block can be used in a step and repeat printing process.

When the fabrication of the modules 12 and switching clusters 14 on wafer 10 has been completed, it normally would be found that certain of the modules, indicated by cross-hatching in FIG. 1, are defective, while other of the modules 12 are operable. To remove the defective modules from the chain and to connect the operable modules, the various switches in the switch clusters 14 are activated. These switches are electrically alterable according to the present invention, and when they have been altered, the operable modules are connected in series, resulting in the present example, in a 256-bit shift register. If a 256-bit register is desired and more of the modules 12 have been found operable, only the required number, here four, need be included in the circuit.

The present invention is concerned only with the switches comprising the switch cluster 14 and not with the specific configuration of the microelectronic circuit modules 12 that are to be interconnected. The ability to form a switching cluster 14 on the wafer 10 at the same time and by the same process as the microelectronic elements 12 to be interconnected are formed is central to the present invention. This ability to reconfigure reliably with reasonable power levels have only materialized recently with the development of MOS and MNOS transistors.

Figure 2A:
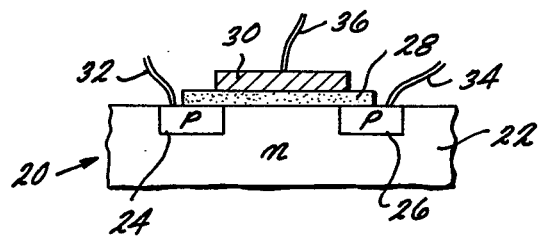
FIG. 2a is a cross-sectional view of a MOS transistor of the type known in the prior art and used in the present invention.
Figure 2B:
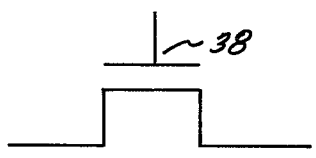
FIG. 2b illustrates the symbol used to represent the MOS transistor.

FIG. 2, including FIGS. 2a and 2b, shows a typical MOS transistor of a type known in the art. FIG. 2a is a cross-sectional view showing the structure of the MOS transistor 20, while FIG. 2b shows the symbol used in FIGS. 4 and 5 to represent the structure shown in FIG. 2a.

The MOS transistor 20 is formed on a substrate 22 of n-type silicon. Two regions of p-type material 24, 26, have been formed in the substrate by diffusion or a similar process. These p-type regions 24, 26, are covered by an overlying layer of oxide 28, which, in turn, is partially covered by an electrode 30 of a conducting material, such as aluminum substantially over the n-region separating the p-type regions 24, 26. One of the p-type regions 24, 26, is denoted the Source region while the other is known as the Drain region. The electrode 30 is called the Gate. Leads 32, 24 may be attached to the p-type regions 24, 26, respectively, or alternatively metallic coatings on the substrate 22 may serve as electrodes. A lead 36 is provided for the gate electrode 30.

It should be noted that the term "gate" or "gate electrode" is widely used in the art to designate the control electrode of an MOS transistor. That electrode is shown in FIG. 2b as an inverted T-shaped portion 38 of the symbol. It is also common in the art to refer to certain devices as "AND" gates, "OR" gates, or simply gates. As a rule, it will be clear from the context whether the electrode or the device is meant.

When a positive voltage is applied to gate electrode 30, the impedance between the source and drain leads 32, 34 is very high and, in effect, an open circuit exists between them. As an increasingly negative voltage is applied to gate electrode 30, a negative field is created in the n-type region causing the impedance between the source and drain leads 32, 34 to be greatly diminished, thereby in effect connecting leads 32 and 34. The applied voltage at which the MOS transistor begins to conduct is referred to as the threshold voltage.

Figure 3A:
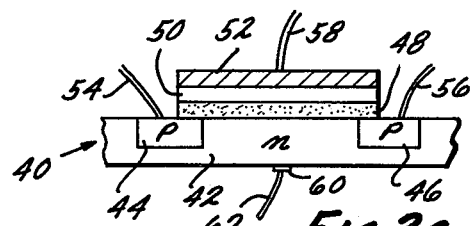
FIG. 3a is a cross-sectional view of a MNOS transistor of the type known in the prior art and used in the present invention.

FIG. 3a shows the structure of an MNOS transistor 40 in cross-section. Like the MOS transistor described above, in FIG. 2a, the MNOS transistor of FIG. 3 is formed on a substrate 42 of n-type silicon. Two p-type regions 44, 46 have been formed in the substrate 42 by a diffusion or other process. A thin layer 48 of oxide is coated onto the substrate so as to partially overlie both of the p-type regions 44, 46. Unlike the MOS transistor described above, the MNOS transistor next includes a layer of silicon nitride 50 interposed between the oxide layer 48 and a conductive gate electrode 52.

The MNOS transistor 40 further differs from the MOS transistor 20 described above in that it has an additional electrode 60 attached to the substrate 42 for applying a bias voltage which can vary the conducting threshold of the MNOS transistor 40. Application of an altering voltage on lead 62 causes "holes" to migrate into the interface region of the transistor, thereby altering its threshold. Therefore, an alteration of the threshold introduced by application of a voltage to the altering electrode 60, remains indefinitely after the altering voltage has been removed. It is the voltage appearing across the silicon nitride layer that is effective in altering the threshold. The threshold will remain substantially unaffected if the voltage across the silicon nitride layer is less negative than some predetermined value.

The voltage across the silicon nitride layer depends on the voltage of the source and gate electrodes. If, for example, the source is at −20 volts and an altering voltage of −30 volts is applied on lead 66, the effective voltage across the silicon nitride layer is only −10 volts which may not be sufficient to produce a substantial change of threshold. On the other hand, if the source is at ground potential, the full −30 volts applied would appear across the silicon nitride layer and the threshold would be altered. This principle is crucial to the operation of the present invention. As will be seen below, the threshold altering capability imparts a "memory" characteristic to the MNOS transistor, which capability is found useful in the preferred embodiment of the invention described below.

Figure 3B:
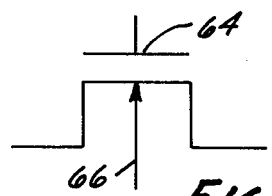
FIG. 3b illustrates the symbol used to represent the MNOS transistor.

FIG. 3b shows the symbol used in the art to denote the MNOS transistor. The gate electrode 64 is shown as in the MOS gate electrode as an inverted T. An arrow 66 denotes the threshold altering electrode 60 and its lead 62.

Figure 4:
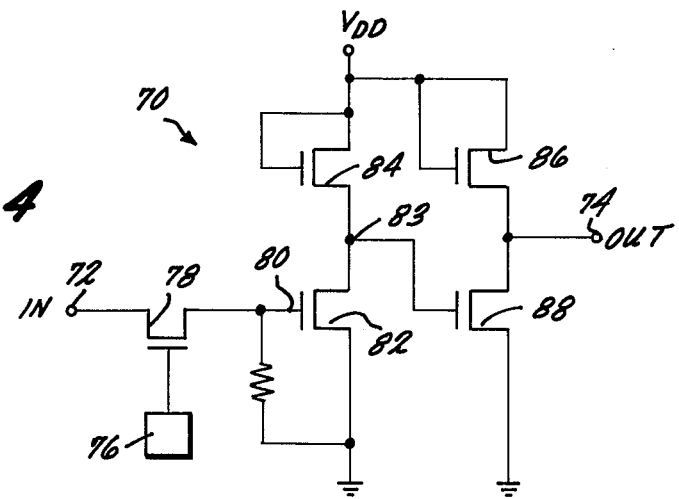
FIG. 4 is a circuit diagram of a noninverting active switch for use in a preferred embodiment of the present invention.

FIG. 4 shows a non-inverting, active switch for use in a preferred embodiment of the present invention. The switch has two states. When the switch is in its "conducting" state, a signal applied at the input terminal 72 will be conducted to the output terminal 74 with amplification. When the switch 70 is in its non-conducting state, a virtually open circuit exists between the input terminal 72 and the output terminal 74.

When a negative voltage is applied to control terminal 76, exceeding the magnitude of the threshold voltage, MOS transistor 78 becomes conductive, and the signal applied to the input terminal 72 is applied to gate electrode 80 of transistor 82. Application of the input signal to gate 80 alters the impedance of gate 82 in a manner determined by the input signal.

When the input signal is relatively large and decreasing, the conductivity of transistor 82 increases causing node 83 to approach the ground potential. Because in the preferred embodiment $V_{DD}$ is a relatively large negative voltage, the voltage at node 83 is therefore increasing as the input signal decreases. This illustrates that the transistor 82 operates as a single stage of amplification but has the undesirable effect of inverting the signal. This undesirable side effect can be eliminated by adding a second stage of amplification using transistor 88. It is well known in the art that transistors 84 and 86 behave like non-ohmic resistors because their gates are connected to one of their other electrodes.

As the voltage at node 83 becomes more positive, the impedance of the second stage amplifier transistor 88 increases causing the signal output on the output terminal 74 to approach $V_{DD}$; that is, to become more negative. Thus, the circuit illustrated in FIG. 4 behaves as a non-inverting active switch to provide an amplified output signal when a relatively large negative voltage is applied to the control terminal 76.

While the circuit of FIG. 4 is capable of performing the interconnect function as long as a control signal is supplied to the control terminal 76, the circuit has no provision for dealing with the situation where the control signal applied to control terminal 76 is interrupted while the device is supposed to be in the conducting state. In such a situation, the interconnection between the microelectronic components would be broken as the switch in FIG. 4 opened. This deficiency of the circuit of FIG. 4 can be remedied by use of the latching circuit 100 described in greater detail in FIG. 5, to generate the control signal.

Figure 5:
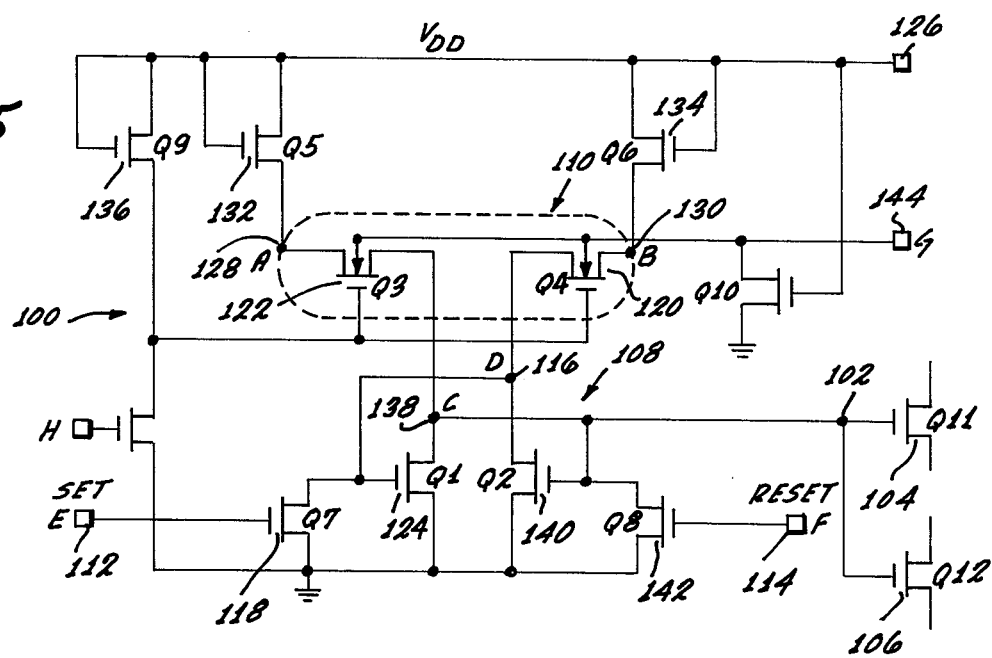
FIG. 5 is a circuit diagram of a non-volatile latching switch used in a preferred embodiment of the present invention.

In the latching circuit 100 of FIG. 5, the control signal for application to control terminal 76 of FIG. 4 is generated at node 102. If interconnection without amplification is desired, the microcircuits to be interconnected are connected to the source and drain of transistors Q11, 104 and Q12, 106. If interconnection with amplification is required, the control signal present at node 102 must be applied to the control terminal 76 of the non-inverting active switch of FIG. 4, in accordance with the preferred embodiment of the present invention.

As was the case in FIG. 4, $V_{DD}$ is a constant voltage, that is negative with respect to ground potential.

The latching circuit of FIG. 5 includes a flip-flop portion 108, and a non-volatile, electrically alterable memory portion 110.

During a complete cycle of operation, the latching circuit 100 of FIG. 5 progresses through three successive states: memory set, operate, and erase.

Briefly, during the memory setting phase, the desired state of the interconnect is set into the flip-flop 108 by applying a voltage to the Set or Reset terminal, 112, 114, respectively, of the flip-flop 108 as desired.

Next, the output state of the flip-flop 108 is entered into the non-volatile, electrically alterable memory. During the operate phase, the state of the flip-flop 108 is determined by the information stored in the memory, and the output state of the flip-flop 108 is used to control the interconnect gates.

Finally, when it is desired to electrically alter the interconnect, an erase phase may be initiated during which the memory is "erased".

If the interconnect is to become engaged, Reset terminal 114 is grounded and a substantial negative voltage $V_{DD}$ is connected to the set terminal 112. This has the effect of grounding node D, 116 through transistor Q7, 118, so that MNOS transistor Q4, 120, is in the conducting state, while MNOS transistor Q3, 122, is in a non-conducting state because transistor Q1, 124 is "off".

With transistor 120 conducting and transistor 122 non-conducting during the memory-setting phase, the source electrode of transistor 120 is at ground potential, while the source of transistor 122 is more negative. Therefore, the applied threshold altering voltage will set the threshold of transistor 120 at a more negative level than the threshold of transistor 122, as described above in connection with FIG. 3.

The basic concept of the electrically alterable interconnection lies in the difference-sensing ability of the flip-flop circuit 108. The non-volatile nitride storage elements provide the impedance differences that set the flip-flop during the operating phase.

Once the thresholds of Q3 and Q4 transistors 120 have been set, the input control voltages applied to the Set and Reset terminals 112, 114, can be turned "off". Since the MNOS memory transistors are non-volatile, $V_{DD}$ can be turned off once the memory states of the Q3 and Q4 transistors 120 have been established.

As power is applied at the start of the operating phase, in the form of a negative voltage $V_{DD}$ applied at terminal 126, the drains of the MNOS transistors Q3 and Q4 (nodes A 128 and B 130) are pulled up through Q5 and Q6 transistors 132, 134 at a rate faster than their respective gates are pulled up through Q9 transistor 136. As $V_{DD}$ rises towards its final negative value, the lower impedance of Q3 transistor 122 pulls the node C 138 to $V_{DD}$, turning on Q2 transistor 140 which turns off Q1 transistor 124. Q1 transistor being turned off helps release the node C 138 to $V_{DD}$, which in turn engages the interconnection Q11 and Q12 transistors 104, 106.

As the final voltage $V_{DD}$ is reached, Q3 transistor 122 is in the non-conducting mode while Q4 transistor 120 is in the conducting mode. Thus, as the interconnect is engaged, the memory data in Q3 and Q4 transistors 122, 120 are enhanced or refreshed continuously by the enhancement of the threshold differences between the two storage Q3 and Q4 transistors 122, 120.

To establish initially the interconnections desired or to alter them at a later stage, the control memory must first be erased. To erase, $V_{DD}$ is set to ground to insure that at least one of the nodes C, 138 or D, 116 is at ground. Q7 and Q8 transistors, 118, 142 are gated to discharge nodes C and D 138, 116 to ground. The isolated substrate of Q3 and Q4 transistors 122, 120 are then pulled to $V_{DD}$, and Q3 and Q4 transistors 122, 120 are both erased. The erase phase is completed by turning Q7 and Q8 transistors 118, 142 "off" and returning node G 144 to open. The erase phase having been completed, the circuit is now ready for initiation of the memory set phase.

Figure 6:
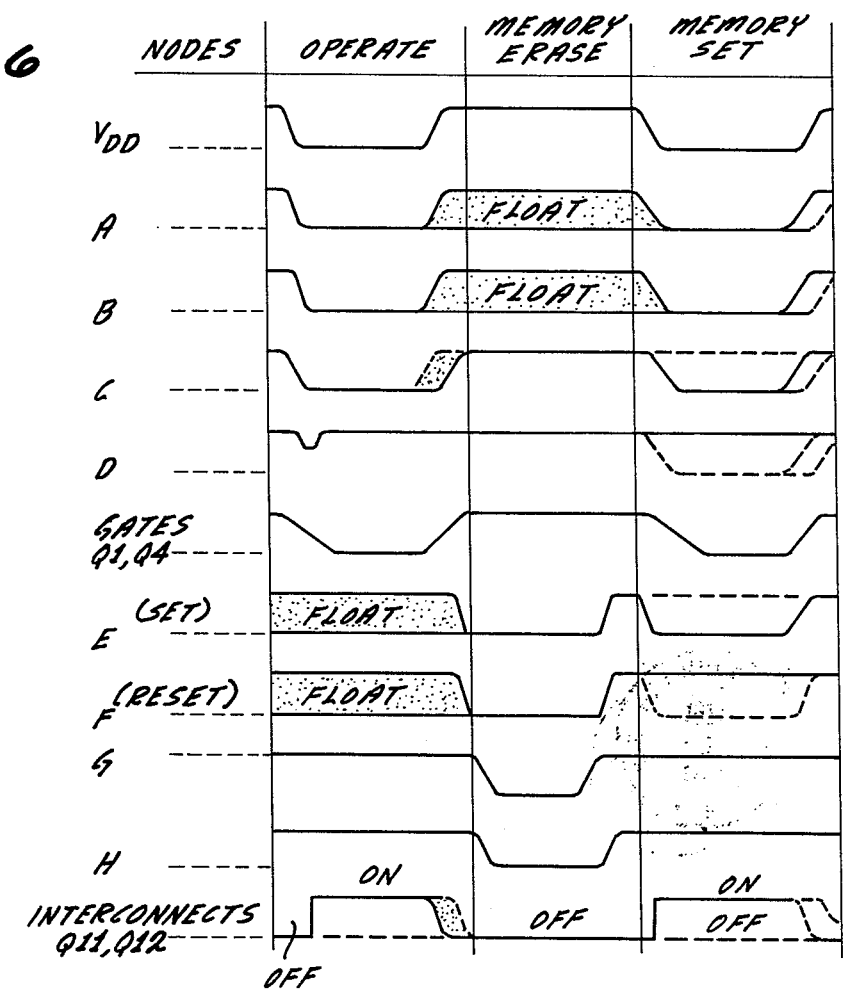
FIG. 6 is a timing diagram showing the voltage waveforms of the non-volatile latching switch of the present embodiment.

The timing diagram of FIG. 6 is based directly on the above description of the operation of the latching circuit 100 of FIG. 5. FIG. 6 merely summarizes and presents graphically what has already been described above. In FIG. 6, the solid lines represent the voltage waveforms throughout the circuit associated with the conductive condition of the interconnect. The dashed lines in FIG. 6 show the voltage waveforms for the alternative, non-conducting state of the interconnect.

Thus, there has been described an electrically alterable non-volatile interconnect comprising a non-volatile, latching, electrically alterable, bistable device and a gate. The gate comprises an active electronic switch supplying amplification to the signal passing through the interconnect in the preferred embodiment. In the preferred embodiment described above, the non-volatile, latching, electrically alterable, bistable device comprises a non-volatile electrically alterable memory, operatively associated with a bistable device in such a way that during a setting phase of the cycle of operation, electrical signals representing the desired conductive state are applied to the bistable device for reading into the non-volatile memory. During a subsequent operating phase, the conductive state information read into the non-volatile memory is used to determine the state of the bistable device. During the operating phase, the non-volatile memory is continually refreshed by the bistable device.

In an alternative embodiment, the gate comprises an MOS transistor which does not amplify the signal. In the preferred embodiment, all of these elements of the interconnect are formed on the same substrate as the microelectronic elements to be interconnected. Further, there has been described a method suitable for use with the interconnect device for activating and deactivating the interconnect device.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. An electrically alterable non-volatile interconnection by which a conductive path may be selectively established and opened between individual microcircuit elements formed in a grid pattern on a wafer, and in which the desired conductive or nonconductive state is set during an initial setting phase of a cycle of operation and maintained indefinitely thereafter during an operating phase until altered during a subsequent erase phase, comprising:

an electrically alterable non-volatile memory into which is read for storage, during the initial setting phase, information defining the desired state;

a bistable device whose state during the operating phase is determined by the information stored in said electrically alterable non-volatile memory, for generating an enable signal during the operating phase;

an electrical by-pass adapted to selectively electrically by-pass each said individual microcircuit element responsive to said enabling signal to allow a signal to by-pass its associated individual microcircuit element; and a non-inverting, amplifying gate, connected between each said microcircuit element and its corresponding by-pass and responsive to the enabling signal to determine the conductance between those elements;

said electrically alterable non-volatile memory, said bistable device, said by-pass and said gate formed on the same wafer as the microcircuit elements are formed.

2. The interconnection of claim 1 in which, during the initial setting phase, the state of said bistable device is established by an applied, externally generated signal, and in which an indication of the state of said bistable device is the information read into said electrically alterable non-volatile memory during initial setting phase.

3. The interconnection of claim 1 in which said electrically alterable non-volatile memory is erasable during the subsequent erase phase.

4. The interconnection of claim 1 in which said electrically alterable non-volatile memory further comprises a MNOS memory transistor.

5. The interconnection of claim 1 in which said gate further includes active means for reducing the impedance of the conductive path.

6. A method for selectively determining the conductive state of an electrical gate connected between microcircuit elements formed on a wafer, comprising the steps of:

forming on the wafer an electrically alterable non-volatile memory, a bistable device operatively connected to said memory, and a non-inverting amplifying gate circuit operatively connected to said bistable device and connected between each microcircuit element, said memory and said bistable device each having a state associated with conduction and a state associated with non-conduction;

setting the desired state of the bistable device during an initial setting phase, by applying to one of its terminals a predetermined signal associated with a chosen one of the two possible conductive states of the gate between the microcircuit elements;

reading into the electrically alterable non-volatile memory, during the initial setting phase, the chosen state of the bistable device;

setting the state of the bistable device, during a subsequent operating phase, by applying to the bistable device the state that was read into and stored in the electrically alterable non-volatile memory during the initial setting phase;

generating an enabling signal from said bistable device indicative of its state; and applying the enabling signal to said gate to determine its conductive state.

7. The method of claim 6 further comprising the additional step of:

erasing said electrically alterable non-volatile memory in a subsequent erase phase of the cycle of operation by applying to it an erase signal.

8. On a monolithic, integrated circuit common wafer of insulative material, the combination comprising:

(a) microelectronic circuit components formed in a grid pattern on said wafer; and (b) an electrically alterable non-volatile interconnection formed on said wafer between each microelectronic circuit component for selectively establishing and opening a conductive path between predetermined ones of said microelectronic circuit components, the desired conductive or non-conductive state being set into said interconnection during an initial setting phase of a cycle of operation and maintained indefinitely thereafter during an operating phase until altered during a subsequent erase phase, said interconnection comprising:
  (1) a non-volatile latching electrically alterable bistable device whose state is established during the initial setting phase by an applied, externally generated signal, for generating an enable signal during the operating phase, and
  (2) a non-inverting signal amplifying gate selectively connected between each said microelectronic circuit component, operative responsive to said bistable device enabling signal to determine the conductance between those microelectronic circuit so connected; and
(c) an electrical by-pass adapted to selectively electrically by-pass each said microelectronic circuit component selectively connected responsive to said enabling signal from said component's corresponding non-volatile latching electrically alterable bistable device.

9. The combination of claim 8 in which said interconnection and said microcircuit elements are formed on said wafer by a common process.

10. The combination of claim 8 in which said non-inverting, amplifying gate further comprises active means for reducing the impedance of the conductive path.

11. The combination of claim 8 in which said non-volatile latching electrically alterable bistable device further comprises a MNOS memory transistor.

12. The combination of claim 8 in which said non-volatile latching electrically alterable bistable device further comprises:
  an electrically alterable non-volatile memory into which is read for storage, during the initial setting phase, information defining the desired conductive state; and,
  a bistable device whose state during the operating phase is determined by the information stored in said electrically alterable non-volatile memory, for generating the enable signal during the operating phase.

* * * * *

UNITED STATES PATENT OFFICE
CERTIFICATE OF CORRECTION

Patent No. 4,092,733    Dated May 30, 1978

Inventor(s) Leland I. Coontz; Morton H. Fox

It is certified that error appears in the above-identified patent and that said Letters Patent are hereby corrected as shown below:

Column 1, line 25, MNOA should be MNOS.

Signed and Sealed this

Twenty-sixth Day of December 1978

[SEAL]

Attest:

RUTH C. MASON
*Attesting Officer*

DONALD W. BANNER
*Commissioner of Patents and Trademarks*